(12) United States Patent
Nakanishi

(10) Patent No.: US 6,222,115 B1
(45) Date of Patent: Apr. 24, 2001

(54) PHOTOVOLTAIC MODULE

(75) Inventor: Naoaki Nakanishi, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/524,633

(22) Filed: Mar. 14, 2000

(30) Foreign Application Priority Data

Nov. 19, 1999 (JP) ................................................. 11-330139

(51) Int. Cl.⁷ ................................................. H01L 31/048
(52) U.S. Cl. .................... 136/251; 136/244; 136/256; 136/258; 257/433; 257/434
(58) Field of Search ................................. 136/244, 251, 136/256, 258 PC, 258 AM; 257/433, 434

(56) References Cited

U.S. PATENT DOCUMENTS

| | | | |
|---|---|---|---|
| 4,067,764 | * | 1/1978 | Walker et al. ................... 136/251 |
| 4,433,200 | * | 2/1984 | Jester et al. ...................... 136/251 |
| 4,468,426 | | 8/1984 | Hatchadoorian et al. . |
| 4,526,831 | * | 7/1985 | Hatchadoorian et al. ........ 428/300.7 |
| 5,478,402 | * | 12/1995 | Hanoka ............................ 136/251 |
| 5,728,230 | * | 3/1998 | Komori et al. .................. 136/251 |

FOREIGN PATENT DOCUMENTS

| | | |
|---|---|---|
| 58-17685 | 2/1983 | (JP) . |
| 60-150658 | 8/1985 | (JP) . |
| WO 95/06561 | * 3/1995 | (WO) . |

* cited by examiner

*Primary Examiner*—Alan Diamond
(74) *Attorney, Agent, or Firm*—Hogan & Hartson, LLP

(57) ABSTRACT

A photovoltaic module having a transparent substrate, solar cells formed on the back surface of the transparent substrate, an encapsulant resin for sealing the solar cells, and a back cover film formed on the back surface of the encapsulant resin, in which the back cover film includes at least a multi-layered film of a polyethylene terephthalate-based supporting film and an amorphous polyester-based heat seal layer formed on the surface of the supporting film which is positioned on the side of the encapsulant resin.

6 Claims, 1 Drawing Sheet

PHOTOVOLTAIC MODULE

CROSS-REFERENCE TO RELATED APPLICATION

This application is based upon and claims the benefit of priority from the prior Japanese Patent Application No. 11-330139, filed Nov. 19, 1999, the entire contents of which are incorporated herein by reference.

BACKGROUND OF THE INVENTION

The present invention relates to a photovoltaic module, particularly, to a photovoltaic module comprising an improved back cover film so as to improve the environmental resistance.

A photovoltaic module, which is arranged on, for example, a roof, is subjected to a severe outdoor environment and, thus, it is strongly required to improve the environmental resistance of solar cells. Various materials of constituting members of the photovoltaic module have been studied in order to improve the environmental resistance of the solar cells.

The construction of, for example, a thin film photovoltaic module will now be described briefly. Specifically, a thin film photovoltaic module comprises a plurality of solar cells each comprising a transparent electrode layer, a photovoltaic semiconductor layer and a back electrode layer, which are stacked one upon the other on the back surface of a front cover glass. The stacked structure formed on the front cover glass is divided into a plurality of strings to form a plurality of solar cells. Also, these solar cells are connected to each other in series so as to form an integrated photovoltaic module. The back surface of the integrated photovoltaic module is sealed with an encapsulant resin such as an ethylene-vinyl acetate copolymer (EVA). Further, the encapsulant resin are protected by a weather-resistant back cover film laminated thereon.

On the other hand, a crystalline photovoltaic module comprises 20 to 30 solar cells formed by using a single crystalline semiconductor wafer having a small area and arranged on a front cover glass. These solar cells are connected to each other by wires so as to form the crystalline photovoltaic module. The back surface of the crystalline photovoltaic module is sealed with an encapsulant resin such as EVA and is further protected by a back cover film, too.

Conventionally, as a material for forming the back cover film, a fluorocarbon resin film (for example, Tedler manufactured by Du Pont), a laminate of fluorocarbon resin/aluminum (Al)/fluorocarbon resin or a laminate of fluorocarbon resin/polyethylene terephthalate (PET)/fluorocarbon resin has been used.

However, the back cover film consisting of a fluorocarbon resin film alone fails to exhibit a sufficiently high humidity resistance, with the result that the metal members sealed with the encapsulant resin such as an output take-out wire and a back electrode tend to be corroded. On the other hand, the presence of the intermediate Al layer or PET layer enables the laminate of fluorocarbon resin/Al/fluorocarbon resin or the laminate of fluorocarbon resin/PET/fluorocarbon resin to be superior to the film consisting of a fluorocarbon resin alone in the humidity resistance. However, the adhesive strength between the fluorocarbon resin film and the encapsulant resin of EVA is not sufficiently high, with the result that the resin film and the EVA tend to peel from each other over a long period of time. Consequently, the metal members inside the photovoltaic module tend to be corroded because of the moisture intrusion through the peeled portion.

As described above, the conventional photovoltaic module is not satisfactory in the adhesive strength between the encapsulant resin and the back cover film, leaving much room for further improvement of the photovoltaic module in respect of the environmental resistance.

It should also be noted that, if the intermediate Al layer is exposed to the outside in the case of using a laminate of fluorocarbon resin/Al/fluorocarbon resin, the Al layer could be brought into contact with the output take-out wire, with the result that the insulation fails to be maintained.

BRIEF SUMMARY OF THE INVENTION

An object of the present invention is to provide a photovoltaic module excellent in environmental resistance by using a back cover film having a high adhesive strength with an encapsulant resin.

According to the present invention, there is provided a photovoltaic module, comprising a transparent substrate, solar cells formed on the back surface of the transparent substrate, an encapsulant resin for sealing the solar cells, and a back cover film formed on the back surface of the encapsulant resin, wherein the back cover film comprises at least a multi-layered film of a polyethylene terephthalate-based supporting film and an amorphous polyester-based heat seal layer formed on the surface of the supporting film which is positioned on the side of the encapsulant resin.

In the present invention, the back cover film may consist of a laminate including a multi-layered film of a polyethylene terephthalate-based supporting film and an amorphous polyester-based heat seal layer, and a fluorocarbon resin film bonded to the back surface of the supporting film constituting the multi-layered film.

In the present invention, it is desirable for the multi-layered film to have a thickness of 30 to 100 $\mu$m.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described in detail with reference to the accompanying drawings.

Figure 1:
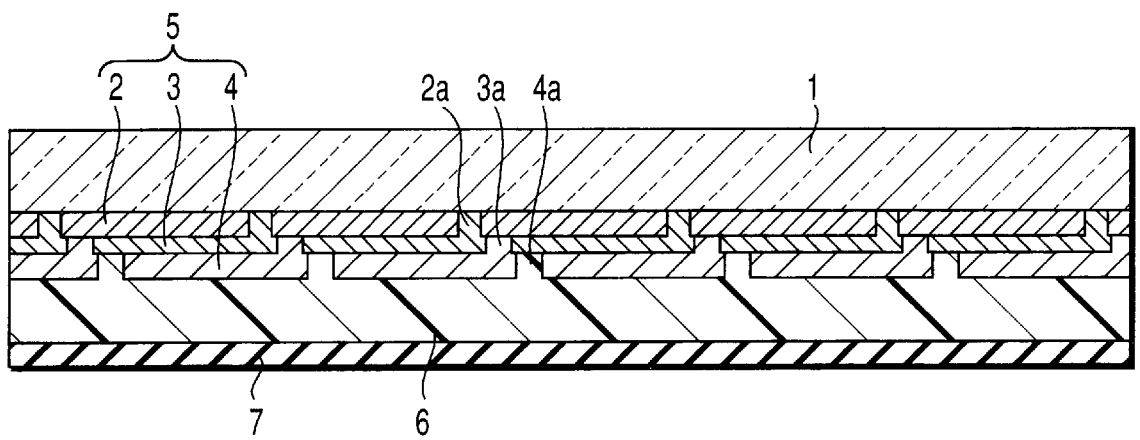
FIG. 1 is a cross sectional view showing a photovoltaic module according to the present invention.

FIG. 1 is a cross sectional view showing a thin film photovoltaic module of the present invention. As shown in the drawing, a stacked structure consisting of a transparent electrode layer 2 made of a transparent conductive oxide (TCO) such as $SnO_2$, a photovoltaic semiconductor layer 3 made of silicon or the like, and a back electrode layer 4 made of, for example, Ag is formed on the back surface of a front cover glass 1. These layers 2, 3, 4 are divided into a plurality of strip-like regions by scribing lines 2a of the transparent electrode layer 2, scribing lines 3a of the photovoltaic semiconductor layer 3 and scribing lines 4a of the back electrode layer 4, the scribing lines 2a, 3a, 4a extending in a direction perpendicular to the paper sheet. The strip-like transparent electrode layer 2, the strip-like photovoltaic semiconductor layer 3 and the strip-like back electrode layer 4, which are stacked one upon the other, collectively form a strip-like solar cell 5. The transparent electrode 2 of an arbitrary solar cell is connected to the back electrode 4 of the adjacent solar cell 5 via the scribing line 3a of the photovoltaic semiconductor layer 3, and thus the plural solar cells 5 are connected to each other in series so as to form an integrated structure.

In the photovoltaic module of the present invention, the transparent electrode layer 2 is formed of $SnO_2$, ITO, a stack of $ITO/SnO_2$, or ZnO. The photovoltaic semiconductor layer 3 is formed of a stack of silicon-based semiconductor layers. The silicon-based semiconductor includes an amorphous silicon layer (a-Si), a hydrogenated amorphous silicon layer (a-Si:H), a hydrogenated amorphous silicon carbide layer (a-SiC:H), an amorphous silicon nitride layer, and an alloy layer containing silicon and another element such as carbon, germanium or tin. The silicon-based semiconductor layers are stacked one upon the other to form a pin-junction, a nip-junction, an ni-junction, a pn-junction, an MIS-junction, a heterojunction, a homojunction, a Schottky junction or a combination of these junctions. Further, a CdS-based material, a GaAs-based material, an InP-based material can also be used for forming the photovoltaic semiconductor layer. The back electrode layer 4 is formed of a metal film such as Ag or Al film or a stacked film of a metal oxide such as ZnO and a metal film such as Ag or Al.

The back surface of the integrated photovoltaic module is sealed by an encapsulant resin 6 such as ethylene-vinyl acetate copolymer (EVA) and is further protected by a weather-resistant back cover film 7 laminated on the encapsulant resin 6. These encapsulant resin 6 and back cover film 7 are formed by a vacuum laminator. In addition to EVA, other resins such as a silicone resin and polybutyral resin can also be used for forming the encapsulant resin 6.

Figure 2:
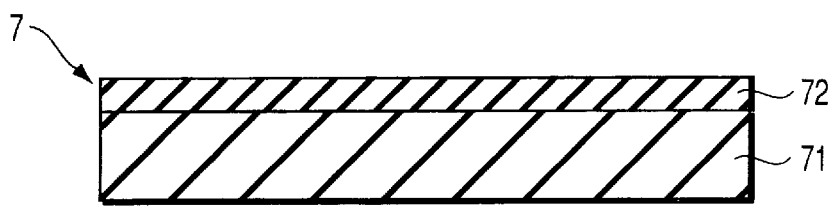
FIG. 2 is a cross sectional view showing an example of the back cover film used in the photovoltaic module of the present invention.

FIG. 2 exemplifies the back cover film 7 used in the present invention. The back cover film 7 shown in FIG. 2 is of a laminate consisting of a PET-based supporting film 71 and an amorphous PET-based heat seal layer 72. The back cover film 7 is arranged such that the heat seal layer 72 is positioned to face the encapsulant resin 6.

Figure 3:
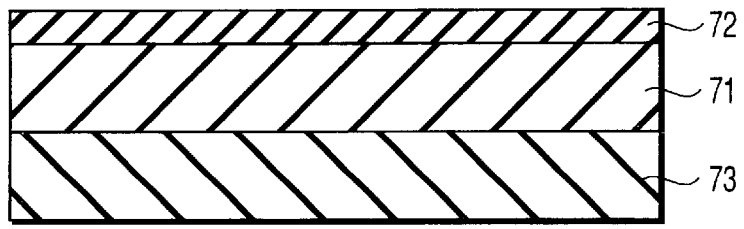
FIG. 3 is a cross sectional view showing another example of the back cover film used in the photovoltaic module of the present invention.

FIG. 3 shows another example of the back cover film 7 used in the present invention. The back cover film 7 shown in FIG. 3 comprises the multi-layered film similar to that shown in FIG. 2, which consists of the PET-based supporting film 71 and the amorphous PET-based heat seal layer 72, and a fluorocarbon resin film 73 adhered to the back surface of the supporting film 71 by using, for example, an urethane adhesive.

A combination of a PET-based supporting film having a thickness of 20 to 100 $\mu$m and an amorphous polyester film having a thickness of 2 to 10 $\mu$m can be suitably used as the multi-layered film of the construction shown in FIG. 2. It is desirable for the supporting film to employ polyethylene terephthalate obtained by condensation between terephthalic acid and ethylene glycol. The material of the polyester-based heat seal layer can be suitably selected from amorphous polycondensates between various dicarboxylic acid component and diol component. It is also possible to use an amorphous mixture of the amorphous polyester and a crystalline PET.

The dicarboxylic acid component of the amorphous polyester, which is not particularly limited, includes, for example, terephthalic acid, isophthalic acid, succinic acid, adipic acid, azelaic acid, 1,10-decanedicarboxylic acid, sebacic acid, and naphthalene 1,4-dicarboxylic acid. The diol component used in the present invention includes, for example, ethylene glycol, propylene glycol, trimethylene glycol, tetramethylene glycol, neopentyl glycol, diethylene glycol and cyclohexane dimethanol. At least one kind of each of dicarboxylic acid components and diol components is selected. It is desirable that the heat seal layer has a glass transition point not higher than 100° C., preferably not higher than 75° C. These multi-layered films can be heat-sealed under temperatures falling within a range of between 140° C. and 200° C.

The materials described above include, for example, Melinex D387, D389 and M342 commercially available from Du Pont.

A peel test was conducted as follows for determining the adhesive strength between the back cover film and the encapsulant resin in respect of the back cover film of the present invention shown in FIG. 3, which consists of the PET-based multi-layered film/fluorocarbon resin film, and the conventional back cover films consisting of a laminate of PET-based crystalline single layer film/fluorocarbon resin film, a laminate of fluorocarbon resin/Al/fluorocarbon resin, and a laminate of fluorocarbon resin/PET/fluorocarbon resin. Melinex D387 described above was used as the PET-based multi-layered film. Melinex M542 was used as the PET-based crystalline single layer film. Further, Tedler was used as the fluorocarbon resin.

At first, an EVA sheet and Melinex D387 were successively placed on a glass substrate such that the heat seal layer is in contact with the EVA sheet, followed by laminating the structure at 150° C. for two hours by using a vacuum laminator. For comparison, additional samples were prepared as above, except that a laminate of Tedler/PET/Tedler or a laminate of Tedler/Al/Tedler was used in place of Melinex D387. In each of these samples, those portions of the EVA sheet and the cover film which protruded from the periphery of the glass substrate were cut off.

Each of these samples was subjected to a peel test in which the cover film was cut to make two parallel slits with a space of 15 mm and then the cover film alone was peeled in a direction of 90° at a speed of 100 mm/min, thereby force per unit length during the peeling was measured so as to evaluate the initial peel strength at the interface between the EVA layer and the sample. A similar peel test was also conducted after each sample was subjected to 10 cycles of humidity resistance test in which each sample was alternately exposed to an environment of 85° C. and a relative humidity of 85% and to an environment of −40° C. so as to evaluate the peel strength after humidity resistance test. Table 1 shows the results.

TABLE 1

| | | Peel strength [N/cm] | |
|---|---|---|---|
| | Cover film | Initial | After humidity resistance test |
| Example | PET-based multi-layered film of present invention/Tedler | >20.0 | 11.4 |
| Comparative Example 1 | PET-based crystalline single layer film/Tedler | 10.0 | <1.0 |
| Comparative Example 2 | Tedler/PET/Tedler | 4.9 | 5.9 |
| Comparative Example 3 | Tedler/Al/Tedler | 5.6 | 7.2 |

The cover film using a PET-based crystalline single layer film as in Comparative Example 1 substantially failed to exhibit a peel strength after the humidity resistance test, supporting that the cover film had poor environmental resistance. On the other hand, the cover film of the Example of the present invention having an amorphous polyester-based heat seal layer exhibited a high initial peel strength and a sufficiently high peel strength even after the humidity resistance test. Clearly, the cover film of the present invention was excellent in its environmental resistance. The cover film of the Example of the present invention was also found to be superior to the conventional fluorocarbon resin film (Comparative Examples 2 and 3) in each of the initial peel strength and the peel strength after the humidity resistance test.

The above description is directed to a thin film photovoltaic module. Needless to say, however, the back cover film of the present invention can also be applied to a crystalline photovoltaic module.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photovoltaic module, comprising:

a transparent substrate;

solar cells formed on the back surface of the transparent substrate;

an encapsulant resin for sealing the solar cells; and a back cover film formed on the back surface of the encapsulant resin, wherein the back cover film comprises at least a multi-layered film of a polyethylene terephthalate-based supporting film and an amorphous polyester-based heat seal layer, the heat seal layer being formed on a surface of the supporting film and is positioned to face the encapsulant resin.

2. The photovoltaic module according to claim 1, wherein said back cover film consists of a laminate including a multi-layered film of the polyethylene terephthalate-based supporting film and the amorphous polyester-based heat seal layer, and a fluorocarbon resin film bonded to another surface of the supporting film.

3. The photovoltaic module according to claim 1, wherein said multi-layered film has a thickness of 30 to 100 μm.

4. The photovoltaic module according to claim 1, wherein said heat seal layer has a glass transition point not higher than 100° C.

5. The photovoltaic module according to claim 4, wherein said heat seal layer has a glass transition point not higher than 75° C.

6. The photovoltaic module according to claim 1, wherein said multi-layered film can be heat-sealed under temperatures falling within a range of between 140° C. and 200° C.

* * * * *